(12) United States Patent
Yang et al.

(10) Patent No.: US 7,706,190 B2
(45) Date of Patent: Apr. 27, 2010

(54) METHOD OF PROGRAM-VERIFYING A NONVOLATILE MEMORY DEVICE USING SUBDIVIDED VERIFICATIONS WITH INCREASING VERIFY VOLTAGES

(75) Inventors: Chang Won Yang, Icheon-si (KR); Jong Hyun Wang, Cheongju-si (KR); Se Chun Park, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 73 days.

(21) Appl. No.: 12/163,921

(22) Filed: Jun. 27, 2008

(65) Prior Publication Data

US 2009/0141561 A1 Jun. 4, 2009

(30) Foreign Application Priority Data

Nov. 29, 2007 (KR) .................. 10-2007-0122619
May 13, 2008 (KR) .................. 10-2008-0044132

(51) Int. Cl.
*G11C 16/34* (2006.01)

(52) U.S. Cl. ............... 365/185.22; 365/185.19; 365/185.25; 365/185.03; 365/185.12

(58) Field of Classification Search ............ 365/185.03, 365/185.12, 185.11, 185.22, 185.19, 185.25, 365/185.33

See application file for complete search history.

(56) References Cited

U.S. PATENT DOCUMENTS

| | | | | |
|---|---|---|---|---|
| 6,853,585 B2 * | 2/2005 | Lee et al. | ............... | 365/185.22 |
| 7,477,550 B2 * | 1/2009 | Son et al. | ............... | 365/185.22 |
| 2009/0141561 A1 * | 6/2009 | Yang et al. | ............. | 365/185.22 |

* cited by examiner

*Primary Examiner*—Andrew Q Tran
(74) *Attorney, Agent, or Firm*—Townsend and Townsend and Crew LLP

(57) ABSTRACT

In a method of operating a non-volatile memory device subdivided verifications are performed by increasing verify voltages. Accordingly, threshold voltage distributions of memory cells can be narrowed and, therefore, the program performance of a flash memory device can be improved.

14 Claims, 2 Drawing Sheets

METHOD OF PROGRAM-VERIFYING A NONVOLATILE MEMORY DEVICE USING SUBDIVIDED VERIFICATIONS WITH INCREASING VERIFY VOLTAGES

CROSS-REFERENCES TO RELATED APPLICATIONS

The present application claims priority to Korean patent application number 10-2007-0122619, filed on Nov. 29, 2007, and Korean patent application number 10-2008-0044132, filed on May 13, 2008, which are incorporated by reference in their entirety.

BACKGROUND OF THE INVENTION

The present invention relates to a method of operating a non-volatile memory device and, more particularly, to a method of operating a non-volatile memory device, which can improve the performance by increasing the verify lines of a page buffer.

Semiconductor memory devices can be classified into random access memory (RAM) and non-volatile memory. RAM is volatile since data stored therein is lost as time goes by and has a rapid input and output of data. Example RAM devices include dynamic random access memory (DRAM) and static random access memory (SRAM). Non-volatile memory can retain data after the data is input.

There is an increasing demand for flash memory to/from which data can be input/output electrically. Flash memory is a device that can be electrically erased at high speed in the state in which circuits are not removed from a board. Flash memory has a simple memory cell structure, and is therefore advantageous in that the production prime cost per unit memory is cheap, and it does not require a refresh function for retaining data.

Flash memory is largely classified into a NOR type and a NAND type. NOR type flash memory requires one contact per two cells, and is disadvantageous in high integration, but is advantageous in high speed due to a high cell current. NAND type flash memory is disadvantageous in high speed due to a low cell current, but is advantageous in high integration since a plurality of contacts shares one contact. Accordingly, the NAND flash memory device has become popular as next-generation memory device, such as those used with MP3 players, digital cameras, mobile devices and auxiliary storage devices.

In recent years, in order to further improve the high integration of flash memory, active research has been done on a multi-bit cell that is able to store a plurality of data bits in one memory cell. This type of memory cell is generally called a multi-level cell (MLC). A memory cell for storing a single data bit is called a single level cell (SLC).

The MLC has been developed to store 4-bit or 8-bit data information from the storage of 2-bit data information. Distributions of the threshold voltage of the flash memory device are subdivided as the number of bits which can be stored increases. As the width of threshold voltage distributions narrows, performance improves. To this end, a method of performing program verification is important. When more verification is performed by setting many verify voltages, the width of the threshold voltage distributions is narrowed.

However, if many verify voltages are set, the number of latch circuits of a page buffer which perform the verify operation is increased. Accordingly, there is a limit to the increase of the verify voltages.

BRIEF SUMMARY OF THE INVENTION

The present invention is directed towards a method of operating a non-volatile memory device, which can improve device performance by subdividing program verify voltages of a non-volatile memory device in order to narrow threshold voltage distributions of a memory cell.

According to an aspect of the present invention, there is provided a method of operating a non-volatile memory device. According to the method, a program operation employing a first program voltage is performed on memory cells. A first program verify operation employing a first verify voltage is performed by using a third latch according to a data state of a first latch of a page buffer coupled to the memory cells. A second program verify operation employing a second verify voltage is performed by using a second latch of the page buffer according to a data state of the first latch. The second verify voltage is higher than the first verify voltage. A third program verify operation employing a third verify voltage higher than the second verify voltage and a fourth program verify operation employing a fourth verify voltage higher than the third verify voltage are sequentially performed by using the second latch according to a data state of the third latch of the page buffer. The second latch is reset by employing the fourth verify voltage. A fifth program verify operation employing a fifth verify voltage higher than the fourth verify voltage is performed by using the second latch according to a data state of the third latch.

If any one of the first to fifth program verify operations does not pass, a program operation employing a second program voltage higher than the first program voltage is performed, and the first to fifth program verify operations are performed again.

The first program verify operation includes transferring data of the first latch to a sensing node of the page buffer, and performing a program verify operation employing the first verify voltage according to a state of the sensing node, wherein the program verify operation is performed through the third latch.

The second program verify operation includes transferring data of the first latch to a sensing node of the page buffer, and performing a program verify operation employing the second verify voltage according to a state of the sensing node, wherein the program verify operation is performed through the second latch.

The third program verify operation includes transferring data of the third latch to a sensing node of the page buffer, and performing a program verify operation employing the third verify voltage according to a state of the sensing node, wherein the program verify operation is performed through the second latch.

The fourth program verify operation includes precharging a sensing node, and performing a program verify operation employing the fourth verify voltage, wherein the program verify operation is performed through the third latch.

The fifth program verify operation includes transferring data of the third latch to a sensing node of the page buffer, and performing a program verify operation employing the fifth verify voltage according to a state of the sensing node, wherein the program verify operation is performed through the second latch.

Each of the first to fifth program verify operations is performed when a sensing node is at a high level.

According to another aspect of the present invention, there is provided a method of operating a non-volatile memory device. According to the method, memory cells are programmed to have first to fourth threshold voltage distributions according to states of input data. First to fourth program verify operations employing first to fourth verify voltages are performed according to states of first to third latches of a page buffer. The second latch is reset using the fourth verify voltage for the fourth program verify operation. A fifth program verify operation employing a fifth verify voltage is performed.

The first and second program verify operations are performed to verify a program operation on memory cells that should be programmed to have the second threshold voltage distribution.

The third program verify operation is performed to verify a program operation on memory cells that should be programmed to have the third threshold voltage distribution.

The fourth and fifth program verify operations are performed to verify a program operation on memory cells that should be programmed to have the fourth threshold voltage distribution.

The first to fifth verify voltages of the first to fifth verify operations increase from the first verify operation to the fifth verify operation.

Data of the second latch, which is coupled to memory cells that should be programmed to have the fourth threshold voltage distribution, changes according to a verify operation of the second latch employing the fourth verify voltage.

DESCRIPTION OF SPECIFIC EMBODIMENT

A specific embodiment according to the present invention will be described with reference to the accompanying drawings. However, the present invention is not limited to the disclosed embodiment, but may be implemented in various ways. The embodiment is provided to complete the disclosure of the present invention and to allow those having ordinary skill in the art to understand the present invention. The present invention is defined by the scope of the claims.

Figure 1:
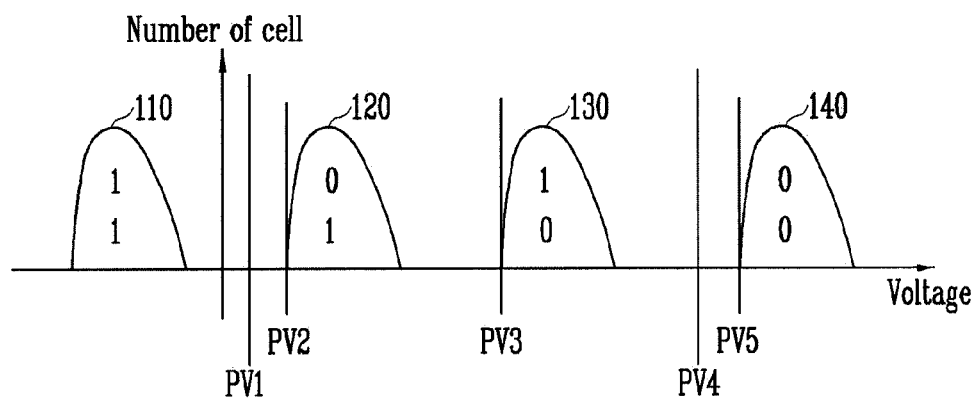
FIG. 1 shows threshold voltage distributions of a flash memory cell.

FIG. 1 shows threshold voltage distributions of a flash memory cell.

Referring to FIG. 1, memory cells that are able to store 2-bit data are programmed according to four threshold voltage distributions. Memory cells belonging to a first threshold voltage distribution 110 having a threshold voltage of 0V voltage or less, that is, an erased state, have a data state [11]. Memory cells belonging to a second threshold voltage distribution 120 have a data state [01] and memory cells belonging to a third threshold voltage distribution 130 have a data state [10]. Finally, memory cells belonging to a fourth threshold voltage distribution 140 having the highest threshold voltage are defined to have a data state [00]. Alternatively, the data states of the first to fourth threshold voltage distributions 110 to 140 may be defined differently.

Generally, when programming memory cells capable of storing 2-bit data, the program of a least significant bit is called a LSB program and the program of a most significant bit is called a MSB program.

A flash memory device, including the memory cells having the threshold voltage distributions of FIG. 1, has the following structure.

Figure 2A:
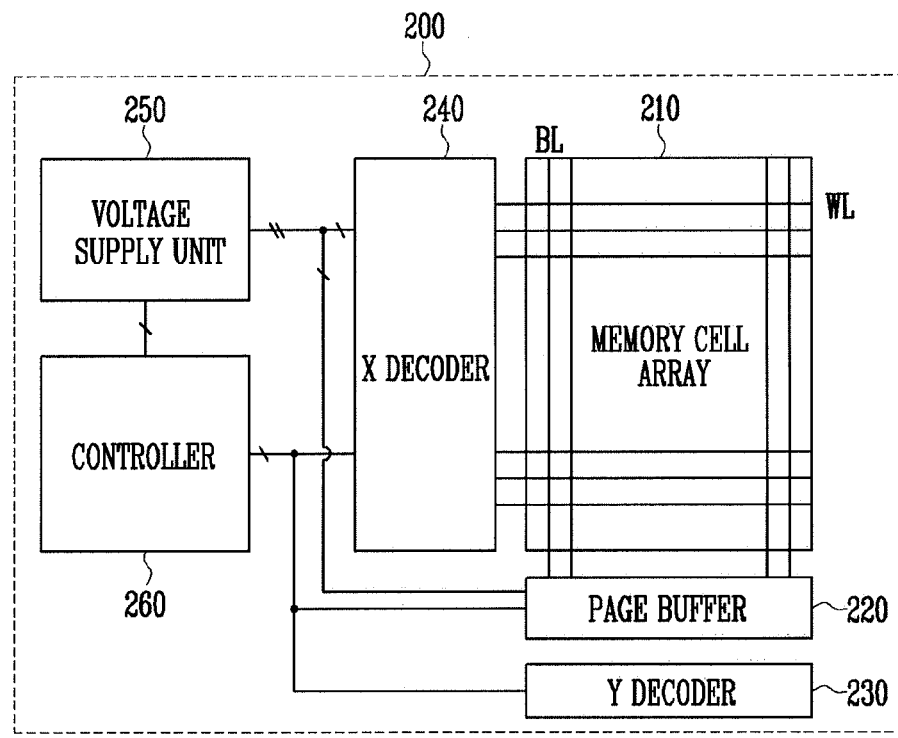
FIG. 2A is a block diagram showing the construction of a flash memory device.

FIG. 2A is a block diagram showing the construction of a flash memory device.

Referring to FIG. 2A, a flash memory device 200 includes a memory cell array 210 in which a plurality of memory cells for storing data is comprised of bit lines BL and word lines WL. The flash memory device 200 further includes a page buffer unit 220 having a plurality of page buffers 270. Each of the page buffers is connected to a pair of the bit lines of the memory cell array 210, and is configured to program and read data.

The flash memory device 200 further includes an X decoder 240 for selecting the word line of the memory cell array 210 in response to an input address and a Y decoder 230 for selecting the page buffer unit 220 in response to an input address.

The flash memory device 200 further includes a voltage supply unit 250 for supplying voltages for performing a program or data read operation, and a controller 260 for controlling the memory cell array 210, the page buffer unit 220, the Y decoder 230, the X decoder 240, and the voltage supply unit 250.

The memory cell array 210 includes the plurality of memory cells for storing data. The page buffer unit 220 includes the plurality of page buffers, each connected to a pair of bit lines of the plurality of bit lines constituting the memory cell array 210. The page buffer performs program, verification, and read operations on a memory cell of a selected bit line.

The X decoder 240 selects a word line of the memory cell array 210 in response to an input address so that an operating voltage supplied from the voltage supply unit 250 is supplied to the word line. The Y decoder 230 selects a page buffer of the page buffer unit 220 in response to an input address and connects the selected page buffer to a data I/O path.

The voltage supply unit 250 supplies voltages necessary for an operation of the flash memory device 200 in response to a control signal of the controller 260. The controller 260 outputs a control signal to control the operation of the flash memory device 200.

Figure 2B:
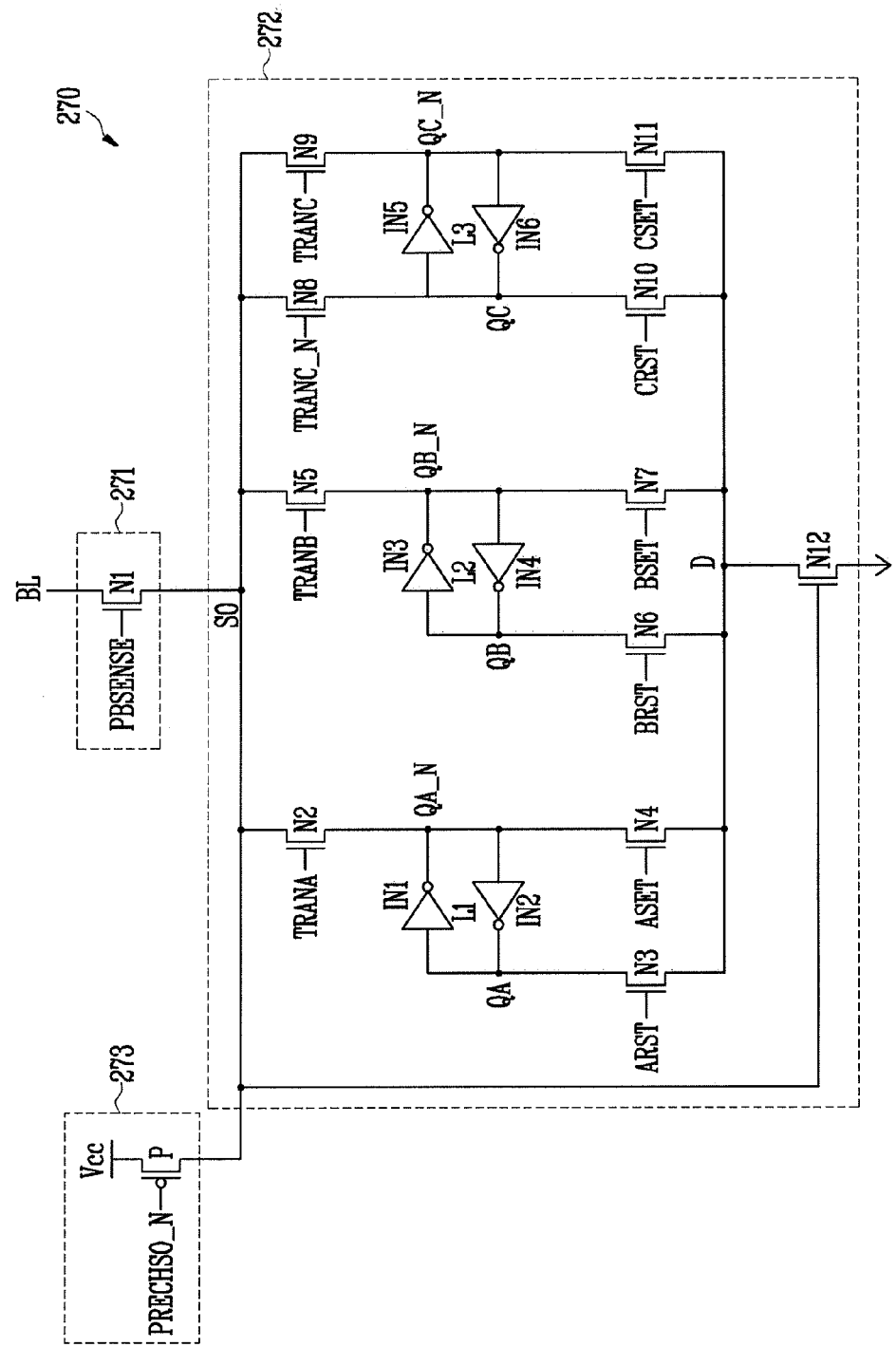
FIG. 2B is a circuit diagram of a page buffer shown in FIG. 2A.

FIG. 2B is a circuit diagram of the page buffer shown in FIG. 2A.

Referring to FIG. 2B, the page buffer 270 includes a bit line select unit 271, a latch unit 272, and a precharge unit 273.

The bit line select unit 271 connects either an even bit line or an odd bit line to the latch unit 272 through a sensing node SO.

The precharge unit 273 precharges the sensing node SO. The latch unit 272 temporarily stores data, which will be programmed into a memory cell, using first to third latches L1 to L3. The latch unit 272 also transfers the stored data to the memory cell through the sensing node SO, or temporarily stores data read from a memory cell.

It is shown in FIG. 2B that the bit line select unit 271 includes only a first NMOS transistor N1 connected between the sensing node SO and the bit line BL. The latch unit 272 includes second to twelfth NMOS transistors N2 to N12 and first to sixth inverters IN1 to IN6. The precharge unit 273 includes a PMOS transistor P.

The PMOS transistor P of the precharge unit 273 is connected between a power supply voltage Vcc and the sensing node SO. A precharge control signal PRECHSO_N is input to the gate of the PMOS transistor P.

The second NMOS transistor N2 of the latch unit 272 is connected between the sensing node SO and a node QA_N. A first data transfer signal TRANA is input to the gate of the second NMOS transistor N2.

The first latch L1 includes the first and second inverters IN1, IN2, which are connected between a node QA and the node QA_N. The third NMOS transistor N3 is connected between the node QA and a node D. A first reset signal ARST is input to the gate of the third NMOS transistor N3.

The fourth NMOS transistor N4 is connected between the node QA_N and the node D. A first set signal ASET is input to the gate of the fourth NMOS transistor N4.

The fifth NMOS transistor N5 is connected between the sensing node SO and a node QB_N. A second data transfer signal TRANB is input to the gate of the fifth NMOS transistor N5.

The second latch L2 includes the third and fourth inverters IN3, IN4, which are connected between a node QB and the node QB_N. The sixth NMOS transistor N6 is connected between the node QB and the node D. A second reset signal BRST is input to the gate of the sixth NMOS transistor N6. Further, the seventh NMOS transistor N7 is connected between the node QB_N and the node D. A second set signal BSET is input to the gate of the seventh NMOS transistor N7.

The eighth NMOS transistor N8 is connected between the sensing node SO and a node QC. An inverted signal TRANC_N of a third data transfer signal TRANC is applied to the gate of the eighth NMOS transistor N8. The ninth NMOS transistor N9 is connected between the sensing node SO and a node QC_N. The third data transfer signal TRANC is input to the gate of the ninth NMOS transistor N9.

The third latch L3 includes the fifth and sixth inverters IN5, IN6, which are connected between the node QC and the node QC_N.

shown in FIG. 2B, verify circuits for checking respective verifications are connected to the respective nodes QA_N, QB_N, and QC_N.

Generally, the first latch L1 of the page buffer 270 is used to perform program verification by employing the first verify voltage PV1 and the forth verify voltage PV 4. Also, the first latch L1 of the page buffer 270 is used for performing data input/output. It is assumed that the second latch L2 is used to perform program verification by employing the second verify voltage PV2, the third verify voltage PV3 and the fifth verify voltage PV5, and the third latch L3 is used to divide the third threshold voltage distribution 130 and the fourth threshold voltage distribution 140 and perform a program verify operation employing the first verify voltage PV1.

In the verify method in accordance with an embodiment of the present invention, the third latch L3 is used for program verification employing the fourth verify voltage PV4. The reason why this method was not used in the prior art is that, if a verify operation employing the fourth verify voltage PV4 was performed in the third latch L3, when memory cells of the third threshold voltage distribution 130 were verified, it also had an effect on memory cells belonging to the fourth threshold voltage distribution 140 and, therefore, an error occurred in program verification of the memory cells belonging to the fourth threshold voltage distribution 140.

Accordingly, an embodiment of the present invention suggests the following operating method.

The following Table 1 lists the states of respective nodes of the page buffer 270 while data is set so as to perform a program operation into respective latches of the page buffer 270, a program operation after a first program pulse is performed, and a verification operation.

TABLE 1

| First program pulse | QA_N | | | | QB_N | | | | QC_N | | | | SO | | | |
|---|---|---|---|---|---|---|---|---|---|---|---|---|---|---|---|---|
| Case | 1 | 2 | 3 | 4 | 1 | 2 | 3 | 4 | 1 | 2 | 3 | 4 | 1 | 2 | 3 | 4 |
| QA_value transferred to SO | 1 | 1 | 0 | 0 | 1 | 0 | 0 | 0 | 1 | 0 | 1 | 0 | 1 | 1 | 0 | 0 |
| Verify using PV1 | 1 | 1 | 0 | 0 | 1 | 0 | 0 | 0 | 1 | 1/0 | 1 | 0 | 0 | 1/0 | 0 | 0 |
| QA_N value transferred to SO | 1 | 1 | 0 | 0 | 1 | 0 | 0 | 0 | 1 | 1/0 | 1 | 0 | 1 | 1 | 0 | 0 |
| Verify using PV2 | 1 | 1 | 0 | 0 | 1 | 1/0 | 0 | 0 | 1 | 1/0 | 1 | 0 | 0 | 1/0 | 0 | 0 |
| QC_N value transferred to SO | 1 | 1 | 0 | 0 | 1 | 1/0 | 0 | 0 | 1 | 1/0 | 1 | 0 | 1 | 1/0 | 1 | 0 |
| Verify using PV3 | 1 | 1 | 0 | 0 | 1 | 1/0 | 1/0 | 0 | 1 | 1/0 | 1 | 0 | 0 | 0 | 1/0 | 0 |
| Verify using PV4 | 1 | 1 | 0 | 0 | 1 | 1/0 | 1/0 | 0 | 1 | 1/0 | 1 | 1/0 | 0 | 0 | 0 | 1/0 |
| QB_N reset to PV4 | 1 | 1 | 0 | 0 | 1 | 1/0 | 1/0 | 0 | 1 | 1/0 | 1 | 1/0 | 0 | 0 | 0 | 1/0 |
| Verify using PV5 | 1 | 1 | 0 | 0 | 1 | 1/0 | 1/0 | 1/0 | 1 | 1/0 | 1 | 1/0 | 0 | 0 | 0 | 1/0 |

The tenth NMOS transistor N10 is connected between the node QC and the node D. A third reset signal CRST is input to the gate of the tenth NMOS transistor N10. The eleventh NMOS transistor N11 is connected between the node QC_N and the node D. A third set signal CSET is input to the gate of the eleventh NMOS transistor N11.

The twelfth NMOS transistor N12 is connected between the node D and a ground voltage. The sensing node SO is connected to the gate of the twelfth NMOS transistor 12.

A method of reading data through the page buffer 270 constructed as above is described below.

First, as shown in FIG. 1, verify voltages for verifying memory cells, which are programmed according to the first to fourth threshold voltage distributions 110 to 140, employ first to fifth verify voltages PV1 to PV5. Further, although not Referring to Table 1 and FIG. 2B, the respective nodes can be displayed as four case states according to the states of data to be programmed.

In order to perform a program, the respective nodes of the page buffer 270 are set, as listed in the cases of Table 1. A program is performed using the first program pulse. A data program is performed according to the state of the node QB_N, and whether to perform verification is determined according to the states of the node QA_N and the node QC_N.

That is, the state of the node QB_N has four kinds of states '1000'. The value '1' denotes an erase cell state of the first threshold voltage distribution 110. Accordingly, when the node QB_N has the state '1', a program operation is not performed.

The remaining states denote '000'. That is, a program operation should be performed on the memory cells so that they have the second to fourth threshold voltage distributions 120 to 140.

When the states of the node QA_N and the node QC_N are '1', verification is performed and, when the states of the node QA_N and the node QC_N are '0', verification is not performed.

After the value of the node QA_N is transferred to the sensing node SO according to the first program pulse, a first verification operation for the first verify voltage PV1 is performed.

In the first verification operation, the verification result is stored in the third latch L3. As mentioned earlier, when the node QA_N is '1', verification is performed and, when the node QA_N is '0', verification is not performed.

However, in the third case, program verification is carried out because the node QC_N is '1'. If the threshold voltage of a second memory cell of the third case has risen higher than the third verify voltage PV3 by the first program pulse, the node QB_N changes to '1'.

After the third verification operation, fourth and fifth verification operations are performed using the fourth verify voltage PV4 and the fifth verify voltage PV5. However, in an embodiment of the present invention, it is assumed that threshold voltages of memory cells do not exceed the fourth verify voltage PV4 by the first program pulse. Therefore, although the fourth and fifth verification operations are performed, there is no change in the state of the node.

However, a case in which some of the memory cells are programmed to have the threshold voltage higher than the fourth verify voltage PV4 in the following second program pulse should not have an error as follows.

TABLE 2

| Second program pulse | QA_N | | | | QB_N | | | | QC_N | | | | SO | | | |
|---|---|---|---|---|---|---|---|---|---|---|---|---|---|---|---|---|
| Case | 1 | 2 | 3 | 4 | 1 | 2 | 3 | 4 | 1 | 2 | 3 | 4 | 1 | 2 | 3 | 4 |
| QA_N value transferred to SO | 1 | 1 | 0 | 0 | 1 | 0 | 0 | 0 | 1 | 0 | 1 | 1/0 | 1 | 1 | 0 | 0 |
| Verify using PV1 | 1 | 1 | 0 | 0 | 1 | 0 | 0 | 0 | 1 | 1/0 | 1 | 1/0 | 0 | 1/0 | 0 | 0 |
| QA_N value transferred to SO | 1 | 1 | 0 | 0 | 1 | 0 | 0 | 0 | 1 | 1/0 | 1 | 1/0 | 1 | 1 | 0 | 0 |
| Verify using PV2 | 1 | 1 | 0 | 0 | 1 | 1/0 | 0 | 0 | 1 | 1/0 | 1 | 1/0 | 0 | 1/0 | 0 | 0 |
| QC_N value transferred to SO | 1 | 1 | 0 | 0 | 1 | 1/0 | 0 | 0 | 1 | 1/0 | 1 | 1/0 | 1 | 1/0 | 1 | 1/0 |
| Verify using PV3 | 1 | 1 | 0 | 0 | 1 | 1/0 | 1/0 | 1/0 | 1 | 1/0 | 1 | 1/0 | 0 | 0 | 1/0 | 1/0 |
| Verify using PV4 | 1 | 1 | 0 | 0 | 1 | 1/0 | 1/0 | 1/0 | 1 | 1/0 | 1 | 1/0 | 0 | 0 | 0 | 1/0 |
| QB_N reset to PV4 | 1 | 1 | 0 | 0 | 1 | 1/0 | 1/0 | 0 | 1 | 1/0 | 1 | 1/0 | 0 | 0 | 0 | 1/0 |
| Verify using PV5 | 1 | 1 | 0 | 0 | 1 | 1/0 | 1/0 | 1/0 | 1 | 1/0 | 1 | 1/0 | 0 | 0 | 0 | 1/0 |

If the threshold voltage of a first memory cell that should be programmed according to the second case is programmed to have the first verify voltage PV1 by the first program pulse, the node QC_N of the third latch L3 changes to '1'. A circuit for verification is also connected to the node QC_N. When the state of the node QC_N changed to '1' is sensed, the first verification operation can be omitted.

In the case of a second or third memory cell that should be programmed according to the third or fourth case, verification is not carried out since the node QC_A is '0', and the node QC_N of the third latch L3 remains set.

A second verification operation is performed using the second verify voltage PV2.

The second verification operation is determined by the node QC_A of the first latch L1, and a verification result is stored in the node QB_N of the second latch L2. Thus, if the threshold voltage of the first memory cell belonging to the second case has changed to have the second verify voltage PV2 or more, the node QB_N of the second latch L2 changes to '1'.

A third verification operation is then performed using the third verify voltage PV3.

In the third verification operation, whether program verification has been performed is determined by the node QC_N of the third latch L3, and a verification result is stored in the second latch L2. In the case of a first memory cell of the second case, the third verification operation is not performed because the node QC_N is '0'.

Referring to Table 2 and FIG. 2B, in the state in which the states of the respective nodes have the states as listed in Table 2 by the first program pulse, a program operation is performed using the second program pulse and verification is then performed. The first to third verification operations are identical to those listed in Table 1, and description thereof is omitted.

If the third memory cells of the fourth case are programmed to have the third verify voltage PV3 or more, the node QB_N has changed to '1' by the third verification operation. The second memory cells of the third case find it difficult to divide the third memory cells of the fourth case. Thus, the following process is performed.

After the third verification operation, program verification is performed once again using the fourth voltage PV4. The fourth verification operation is performed on all of the memory cells in the same manner, and a verification result is stored in the third latch L3. To this end, before the fourth verification operation is performed, the sensing node is precharged to '1'.

Verification is then performed using the fourth verify voltage PV4. The first and second memory cells of the second and third cases cannot be programmed to have the threshold voltage higher than the fourth verify voltage PV4, and description thereof is omitted.

When the third memory cells of the fourth case are programmed to have the fourth threshold voltage or more by the fourth verification operation, the node QC_N becomes '1'.

After the fourth verification operation, in the state in which voltage of the bit line is changed by applying the fourth verify voltage PV4 to a selected word line, the second reset signal BRST of the second latch L2 is applied the memory cells, thereby resetting the node QB_N.

If, as a result of the reset, the threshold voltage of the memory cells has the fourth verify voltage PV4, the node QB_N becomes '0'. However, when the threshold voltage is below the fourth verify voltage PV4, the previous setting state is not changed. Accordingly, if the third memory cells of the fourth case have been programmed to have the fourth verify voltage PV4 or more, the node QB_N changes to '0'.

Lastly, a fifth verification operation employing the fifth verify voltage PV5 is performed. Here, whether the fifth verification operation has been verified is decided by the node QC_N of the third latch L3, and a decision result is stored in the second latch L2.

When the fourth verification operation is performed as described above, the node QC_N connected to the fourth memory cells of the fourth case has changed to '1'. Thus, the fifth verification operation can be performed only on the fourth memory cells.

If, as a result of the fifth verification operation, the threshold voltage of the memory cells has not changed to the fifth verify voltage PV5 or more, the node QB_N maintains '0'. However, if, as a result of the fifth verification operation, the threshold voltage of the memory cells has changed to the fifth verify voltage PV5 or more, the node QB_N becomes '1'.

If the node QB_N of the page buffer becomes '1' through all the above processes, it can be determined that a selected word line has been fully programmed.

The program method operated as above in accordance with an embodiment of the present invention is described below by using actual data states as examples.

It is first assumed that an erased cell, belonging to the first threshold voltage distribution 110, is programmed to belong to the fourth threshold voltage distribution 140. That is, a program of [00] is performed in the data state [11], which belongs to the fourth case of Tables 1 and 2. Thus, memory cells to be programmed are referred to as the third memory cells, as mentioned earlier.

It is assumed that the threshold voltages of the third memory cells do not rise over the fourth verify voltage PV4 by the first program pulse. Thereafter, the threshold voltages of the third memory cells rise over the fourth verify voltage PV4 by the second program pulse.

Then, the node QB_N changes to '1' by the fourth verification operation. However, the third memory cells should be programmed to have the fifth verify voltage or more. Accordingly, after the node QB_N is reset using the fourth verify voltage PV4, the fifth verification operation is performed again.

Through this operation, double verification operations employing the fourth verify voltage and the fifth verify voltage can be performed on the third memory cells which should be programmed according to the fourth case. Accordingly, if the levels of verify voltages are 5 or more, threshold voltage distributions after memory cells are programmed can be controlled to be narrow. Controlling the width of threshold voltage distributions to be narrow can be performed using various algorithms, including a double verify method.

As described above, according to the method of operating a non-volatile memory device in accordance with the present invention, subdivided verifications are performed by increasing verify voltages. Accordingly, threshold voltage distributions of memory cells can be narrowed and, therefore, the program performance of a flash memory device can be improved.

The embodiment disclosed herein has been proposed to allow a person skilled in the art to easily implement the present invention, and the person skilled in the art may implement the present invention in various ways. Therefore, the scope of the present invention is not limited by or to the embodiment as described above, and should be construed to be defined only by the appended claims and their equivalents.

What is claimed is:

1. A method of operating a non-volatile memory device, the method comprising:
    performing a program operation on memory cells, wherein the program operation employs a first program voltage;
    performing a first program verify operation, employing a first verify voltage, by using a third latch according to a data state of a first latch of a page buffer coupled to the memory cells;
    performing a second program verify operation, employing a second verify voltage, by using a second latch of the page buffer according to a data state of the first latch, wherein the second verify voltage is higher than the first verify voltage;
    sequentially performing a third program verify operation, employing a third verify voltage higher than the second verify voltage, and a fourth program verify operation, employing a fourth verify voltage higher than the third verify voltage, wherein the third program verify operation and the fourth program verify operation are performed using the second latch according to a data state of the third latch of the page buffer;
    resetting the second latch by employing the fourth verify voltage; and
    performing a fifth program verify operation, employing a fifth verify voltage higher than the fourth verify voltage, wherein the fifth program verify operation is performed using the second latch according to a data state of the third latch.

2. The method of claim 1, wherein if any one of the first to fifth program verify operations does not pass, a program operation employing a second program voltage higher than the first program voltage is performed; and the first to fifth program verify operations are performed again.

3. The method of claim 1, wherein the first program verify operation comprises:
    transferring data of the first latch to a sensing node of the page buffer; and
    performing a program verify operation employing the first verify voltage according to a state of the sensing node, wherein the program verify operation is performed through the third latch.

4. The method of claim 1, wherein the second program verify operation comprises:
    transferring data of the first latch to a sensing node of the page buffer; and
    performing a program verify operation employing the second verify voltage according to a state of the sensing node, wherein the program verify operation is performed through the second latch.

5. The method of claim 1, wherein the third program verify operation comprises:
    transferring data of the third latch to a sensing node of the page buffer; and
    performing a program verify operation employing the third verify voltage according to a state of the sensing node, wherein the program verify operation is performed through the second latch.

6. The method of claim 1, wherein the fourth program verify operation comprises:
precharging a sensing node; and
performing a program verify operation employing the fourth verify voltage, wherein the program verify operation is performed through the third latch.

7. The method of claim 1, wherein the fifth program verify operation comprises:
transferring data of the third latch to a sensing node of the page buffer; and
performing a program verify operation employing the fifth verify voltage according to a state of the sensing node, wherein the program verify operation is performed through the second latch.

8. The method of claim 1, wherein each of the first to fifth program verify operations is performed when a sensing node is at a high level.

9. A method of operating a non-volatile memory device, the method comprising:
programming memory cells so that the memory cells have first to fourth threshold voltage distributions according to states of input data;
performing first to fourth program verify operations employing first to fourth verify voltages according to states of first to third latches of a page buffer;
resetting the second latch using the fourth verify voltage for the fourth program verify operation; and
performing a fifth program verify operation employing a fifth verify voltage.

10. The method of claim 9, wherein the first and second program verify operations are performed to verify a program operation on memory cells that should be programmed to have the second threshold voltage distribution.

11. The method of claim 9, wherein the third program verify operation is performed to verify a program operation on memory cells that should be programmed to have the third threshold voltage distribution.

12. The method of claim 9, wherein the fourth and fifth program verify operations are performed to verify a program operation on memory cells that should be programmed to have the fourth threshold voltage distribution.

13. The method of claim 9, wherein the first to fifth verify voltages of the first to fifth program verify operations increase from the first program verify operation to the fifth program verify operation.

14. The method of claim 9, wherein data of the second latch changes according to a verify operation of the second latch employing the fourth verify voltage, wherein the second latch is coupled to memory cells that should be programmed to have the fourth threshold voltage distribution.

* * * * *